United States Patent
Mihajlovic et al.

(10) Patent No.: US 9,830,966 B2
(45) Date of Patent: Nov. 28, 2017

(54) THREE TERMINAL SOT MEMORY CELL WITH ANOMALOUS HALL EFFECT

(71) Applicant: HGST Netherlands B.V., Amsterdam (NL)

(72) Inventors: Goran Mihajlovic, San Jose, CA (US); Neil Smith, San Jose, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 14/927,414

(22) Filed: Oct. 29, 2015

(65) Prior Publication Data

US 2017/0125078 A1    May 4, 2017

(51) Int. Cl.
*H01L 43/06* (2006.01)
*G11C 11/18* (2006.01)
(Continued)

(52) U.S. Cl.
CPC ........ *G11C 11/161* (2013.01); *G11C 11/1675* (2013.01); *H01L 43/04* (2013.01);
(Continued)

(58) Field of Classification Search
CPC ....... H01L 43/04; H01L 43/06; H01L 43/065; H01L 43/08; H01L 43/10; G11C 11/14–11/16; G11C 11/18; G11C 11/161
See application file for complete search history.

(56) References Cited

U.S. PATENT DOCUMENTS 9,218,864 B1 * 12/2015 Yi ........................ G11C 11/161
2014/0056061 A1    2/2014 Khvalkovskiy et al.
(Continued)

FOREIGN PATENT DOCUMENTS

CN    104393169 A    3/2015

OTHER PUBLICATIONS

Study of Two Writing Schemes for a Magnetic Tunnel Junction Based on Spin Orbit Torque <http://waset.org/publications/16146/study-of-two-writing-schemes-for-a-magnetic-tunnel-junction-based-on-spin-orbit-torque>, 2013.
(Continued)

*Primary Examiner* — Allison P Bernstein
(74) *Attorney, Agent, or Firm* — Patterson & Sheridan LLP (57) ABSTRACT

A method and apparatus for deterministically switching a free layer in a spin orbit torque magnetoresistive random access memory (SOT-MRAM) cell is disclosed herein. In one embodiment, an SOT-MRAM memory cell is provided. The SOT-MRAM memory cell includes a magnetic tunnel junction, a ferromagnetic bias layer, and an antiferromagnetic layer. The magnetic tunnel junction includes a free layer having primarily two bi-stable magnetization directions, a reference layer having a fixed magnetization direction, and an insulating tunnel barrier layer positioned between the free layer and the reference layer. The ferromagnetic bias layer is configured to provide spin orbit torque via anomalous Hall effect and simultaneously configured to provide a magnetic bias field on the free layer to achieve deterministic switching. The antiferromagnetic layer is positioned below the ferromagnetic bias layer and is configured to pin a magnetization direction of the ferromagnetic bias layer in a predetermined direction.

16 Claims, 4 Drawing Sheets

(51) Int. Cl.
*G11C 11/16* (2006.01)
*H01L 43/08* (2006.01)
*H01L 43/04* (2006.01)
*H01L 43/10* (2006.01)

(52) U.S. Cl.
CPC ............ *H01L 43/065* (2013.01); *H01L 43/08* (2013.01); *H01L 43/10* (2013.01)

(56) References Cited

U.S. PATENT DOCUMENTS

2014/0264671 A1     9/2014   Chepulskyy et al.
2015/0041934 A1*    2/2015   Khvalkovskiy ......... H01L 43/02
                                                         257/421

OTHER PUBLICATIONS

Bishnoi, et al.; Architectural Aspects in Design and Analysis of SOT-Based Memories; dated 2014; 8 total pages.

Cubukcu, et al.; Spin-Orbit-Torque Magnetization Switching of a Three-Terminal Perpendicular Magnetic Tunnel Junction; dated Jan. 2014; 17 total pages.

Kim, et al.; Multilevel Spin-Orbit Torque MRAMs; IEEE Transactions on Electron Devices, vol. 62, No. 2; dated Feb. 2015; 8 total pages.

\* cited by examiner

THREE TERMINAL SOT MEMORY CELL WITH ANOMALOUS HALL EFFECT

BACKGROUND OF THE DISCLOSURE

Field of the Disclosure

Embodiments of the present disclosure generally relate to magnetic storage elements, and more particularly to memory cells in a magnetoresistive random-access memory device (MRAM).

Description of the Related Art

MRAM is a non-volatile random-access memory technology. Unlike conventional RAM, data in MRAM devices are not stored as electric charge or current flows. Rather, data is stored by magnetic storage elements. MRAM devices include cells or elements having a magnetically hard layer (i.e., a "reference" layer) and a magnetically soft layer (i.e., the "free" layer). Writing to MRAM is performed by passing current through current leads that are formed on either side of each memory element in order to create a local induced magnetic field, which sets the direction of the soft layer magnetization. Significant problems arise when scaling these devices to high densities. Particularly, the currents required to generate sufficient field to switch the free layer become prohibitively large, and disturbances to neighboring cells or elements can occur during writing, which in turn may cause a neighboring cell to be erroneously written.

Spin transfer torque (STT) MRAM devices are similar to conventional MRAM devices except that the write current paths pass through the magnetic layers of each memory element. The free layer is set via the spin transfer torque from the spin polarized current passing through the reference magnetic layer.

Spin orbit torque (SOT) MRAM devices are similar to STT-MRAM devices except that the read and write paths are independent. Because the write current does not pass through the reference and free magnetic layers, SOT-MRAM devices can have better endurance.

As high density nonvolatile memory devices become increasingly more popular in diverse applications, there is a continual need for improved MRAM devices. Thus, what is needed is an improved SOT-MRAM device with an improved chip design and improved potential memory density limitations.

SUMMARY OF THE DISCLOSURE

The present disclosure, which generally relates to a method and apparatus for deterministically switching a perpendicularly magnetized free layer in a spin orbit torque magnetoresistive random access memory (SOT-MRAM) cell, is disclosed herein.

In one embodiment, an SOT-MRAM memory cell is provided. The SOT-MRAM memory cell includes a free layer, a non-magnetic spin orbit torque (SOT) layer, an exchange-pinned ferromagnetic bias layer, and an antiferromagnetic (AFM) layer. The SOT layer is chosen to exhibit a substantial spin-Hall effect (SHE). It is positioned below the free layer, and is configured to provide spin orbit torque on the free layer via SHE when electrical (write) current is passed through it. The ferromagnetic bias layer is positioned below the SOT (or SHE) layer and is configured to provide a static in-plane magnetic bias field to the free magnetic layer to achieve deterministic switching of the free layer from a first magnetization state to a second magnetization state. The AFM layer is positioned below the ferromagnetic bias layer. The AFM layer is configured to exchange pin a preferred magnetization direction of the ferromagnetic bias layer.

In another embodiment, a SOT-MRAM memory cell is disclosed herein. The SOT-MRAM memory cell includes a free layer, a nonmagnetic spacer layer, an exchange pinned ferromagnetic bias layer and an AFM layer. In this case, the ferromagnetic bias layer is chosen to produce a substantial anomalous Hall effect (AHE) to provide spin orbit torque on the free layer, in addition to also providing a static in-plane magnetic bias field to permit a deterministic switching of the free layer from a first magnetization state to a second magnetization state. The spacer is positioned between the free layer and the magnetic bias/AHE layer. The spacer magnetically decouples the free layer from the bias layer, and allows passage of a spin current from the magnetic bias/AHE layer to the free layer when an electrical (write) current flows in the bias/AHE layer. The AFM layer is positioned below the magnetic bias layer. The AFM layer is configured to exchange pin a preferred magnetization direction of the ferromagnetic bias layer.

In another embodiment, a method for deterministically switching a free layer in an SOT-MRAM cell is disclosed herein. The method includes providing a current through a spin Hall effect layer such that a magnetization direction of a ferromagnetic bias layer creates an angle with respect to a direction of the current to generate a magnetic bias field parallel with the direction of the current as well as a spin current perpendicular to the cell to deterministically switch a free layer from a first magnetization state to a second magnetization state.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered an element or limitation of the appended claims except where explicitly recited in a claim(s).

The present disclosure relates to a method and apparatus for deterministically switching a free layer in a spin orbit torque magnetoresistive random access memory (SOT-MRAM) cell is disclosed herein. In one embodiment, an SOT-MRAM memory cell is provided. The SOT-MRAM memory cell includes a magnetic tunnel junction, a ferromagnetic bias layer, and an antiferromagnetic layer. The magnetic tunnel junction includes a free layer having primarily two bi-stable magnetization directions, a reference layer having a fixed magnetization direction, and an insulating tunnel barrier layer positioned between the free layer and the reference layer. The ferromagnetic bias layer is configured to provide spin orbit torque via anomalous Hall effect and simultaneously configured to provide a magnetic bias field on the free layer to achieve deterministic switching. The antiferromagnetic layer is positioned below the ferromagnetic bias layer and is configured to pin a magnetization direction of the ferromagnetic bias layer in a predetermined direction.

Figure 1:
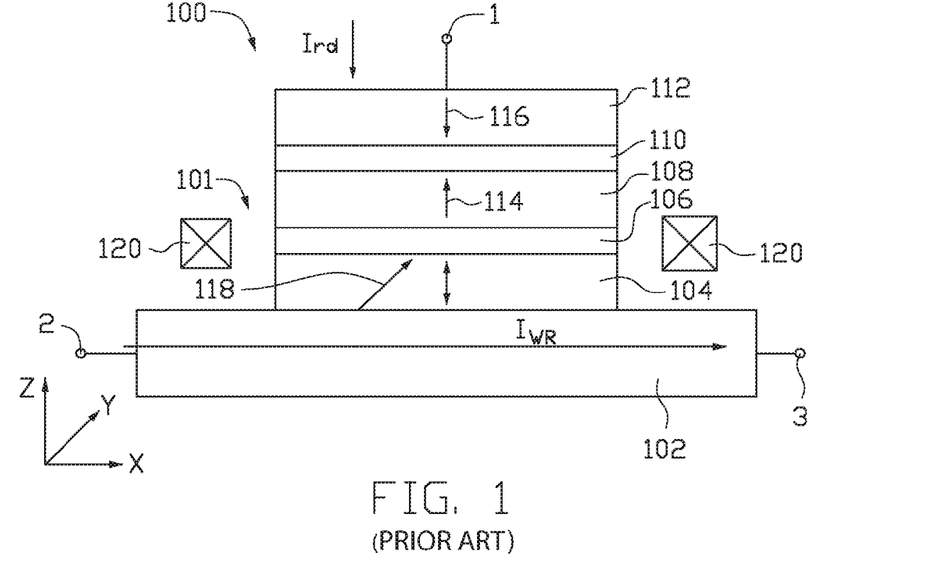
FIG. 1 illustrates an element of a spin orbit torque magnetic random access memory (SOT-MRAM) device, according to an embodiment known in the prior art.

FIG. 1 illustrates a conventional element 100 of an SOT-MRAM, according to one embodiment known in the prior art. The element 100 may be a three-terminal memory cell. The element 100 includes an SOT layer 102, a magnetic tunnel junction 101, an AP-coupling layer 110, and a "hard" layer 112. The magnetic tunnel junction 101 includes a free layer 104, a reference layer 108, and a tunnel barrier layer 106 separating the free layer 104 from the reference layer 108. The magnetization of the hard layer 112 maintains a fixed orientation perpendicular to the plane (e.g., in the "down direction 116 in FIG. 1) via strong perpendicular magnetic anisotropy (PMA). The magnetization of the reference layer 108 is maintained antiparallel (e.g., in the "up" direction 114 in FIG. 1) to that of the hard layer 112 via strong antiparallel coupling (AP) between these layers promoted by the addition of a strong AP-coupling layer 110, typically made of Ru The magnetization of the free layer 104 is nominally kept in a perpendicular orientation (i.e. along the z-axis) by PMA of sufficient strength, but its direction can be switched between two states: parallel or antiparallel to the reference layer 108, in response to the SOT generated by passing electrical current $I_{WR}$ through the SOT layer 102. For the case shown in FIG. 1, in the parallel state, the magnetization of the free layer 104 points in the upward z-direction. In the anti-parallel state, the magnetization of the free layer 104 points in the downward z-direction. The two states of magnetization of the free layer 104 may correspond to logical states of 0 and 1. The SOT layer 102 may be a heavy metal, such as platinum, tantalum, or tungsten. The SOT layer 102 is in physical contact with the free layer 104.

The element 100 further includes three terminals: terminal 1, terminal 2, and terminal 3. A write current, $I_{wr}$ may be applied through the SOT layer 102 between terminal 2 and terminal 3. A read current, $I_{rd}$, may be applied through the element 100 from terminal 1 to terminal 3.

To write the element 100, the write current is applied through the SOT layer 102 between terminal 2 and terminal 3. To deterministically switch the magnetization direction of the free layer during writing, an additional magnetic bias field, $H_B$, is required. The magnetic bias field may be obtained by using permanent magnets 120 positioned about the element 100. The combination of the magnetic bias field oriented in plane with the write current $I_{wr}$, and parallel to the write current, results in a spin orbit torque 118 in the y-direction. The spin orbit torque 118 exerts a torque on the initial magnetization of the free layer 104 so that the magnetization may change, for example, from a parallel state to an anti-parallel state. However, fabrication of the additional permanent magnet biasing layers external to the SOT-MRAM stack structure offers a substantial technical challenge.

Figure 2:
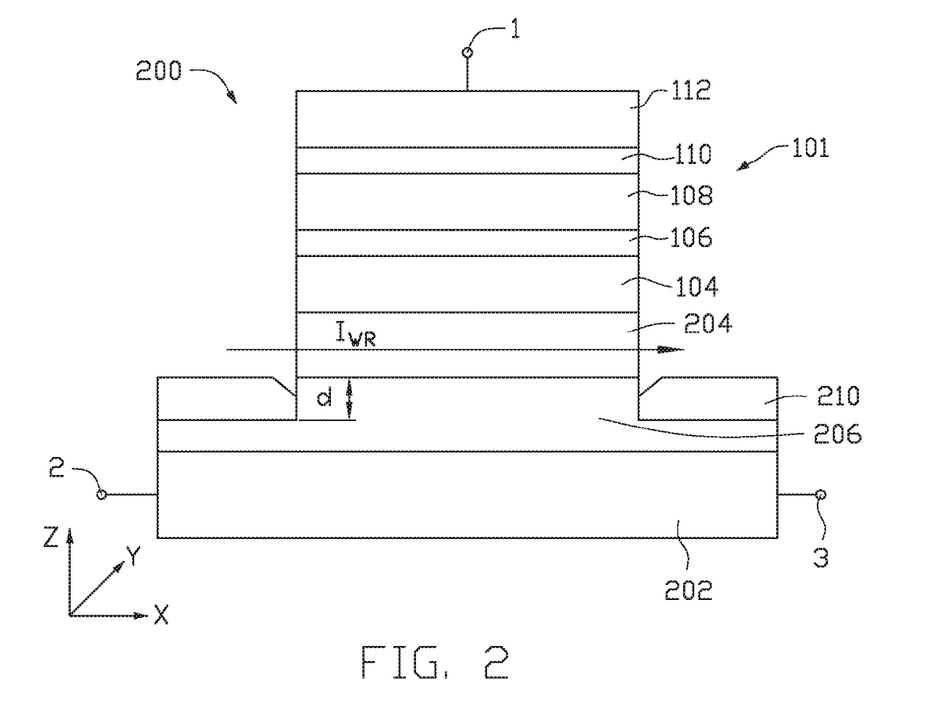
FIG. 2 illustrates an improved element of an SOT-MRAM device, according to an embodiment.

FIG. 2 illustrates an improved element 200 of an SOT-MRAM device, according to one embodiment disclosed herein. The element 200 includes an AFM layer 202, a ferromagnetic bias layer 206, a nonmagnetic spin Hall effect layer 204, the free layer 104, the tunnel barrier layer 106, the reference layer 108, the AP-coupling (ruthenium) layer 110, and the hard layer 112. The spin Hall effect layer 204 is positioned beneath the free layer 104, and is in contact with the free layer 104. The spin Hall effect layer 204 is formed from a material that is not magnetic and exhibits substantial spin Hall effect. The spin Hall effect is a transport phenomenon in a nonmagnetic conductor consisting of the generation of spin current flow in a direction perpendicular to the plane defined by electrical current direction and that of the spin polarization direction. The ferromagnetic bias layer 206 is configured to generate a magnetic bias field via its stray field. The write current flowing in the x-direction inside the spin Hall effect layer 204 generates a spin current of y-polarization that flows in the vertical z-direction, up the element 200. The spin Hall effect layer 204 may be formed from, for example, Pt, Ta, W, or copper doped with either bismuth or iridium, or combinations thereof. In the case of Pt, which is known to become partially polarized (magnetically) at the interface with a ferromagnetic layer (e.g. free layer 104), one can additionally include a very thin (e.g., 1-2 nm), nonmagnetic metallic layer (of relatively high resistivity such as AgSn) between the (Pt) spin Hall effect layer 204 and the free layer 104.

The ferromagnetic bias layer 206 is configured to provide an in-plane magnetic bias field to the free layer 104 via its stray field, primarily along the x-axis, in order to achieve deterministic switching of the magnetization of the free layer 104. This can be achieved by partially milling the ferromagnetic bias layer 206 to a depth d, with respect to the spin Hall effect layer 204. The milling depth, d, provides additional knob for adjusting the strength of the stray magnetic field on the free layer 104. The milling depth may be anywhere between 0 nm and t nm, where t is the thickness of the ferromagnetic bias layer 206. Because the ferromagnetic bias layer 206 is configured to generate a magnetic bias field, it eliminates the need for permanent magnets (as shown in FIG. 1), and simplifies the chip design for SOT-MRAM cells.

The AFM layer 202 is configured to pin the magnetization direction of the ferromagnetic bias layer 206, along x direction via exchange bias. In one embodiment, the AFM layer 202 may be composed of an antiferromagnetic material. For example, the AFM layer 202 may comprise IrMn.

The element 200 further includes three terminals: terminal 1, terminal 2, and terminal 3. A read current, $I_{rd}$, may be applied through the element 200 from terminal 1 to terminal 3. A write current, $I_{wr}$ may be applied through terminal 2 and terminal 3, some fraction of which can flow up and into (and down and out of) the spin Hall effect layer 204 when passing underneath.

Due to the high resistivity of most materials for the AFM layer 202 (e.g. IrMn), the Joule heating due to the write current flow in the extended regions of AFM layer 202 between adjacent memory cells when running a high current density through the ferromagnetic bias layer 206 may be problematic. Additionally, it is desired that as large a fraction as possible of the write current flow through the spin Hall effect layer 204. A capping layer 210 may be deposited on the ferromagnetic bias layer 206 to cover most, if not all, of the ferromagnetic bias layer 206 in the extended regions between memory cells, getting as close as practical to the side walls of layers 204 and 206. The capping layer 210 may be formed from a high conductivity material, such as gold, copper, or silver.

Figure 3:
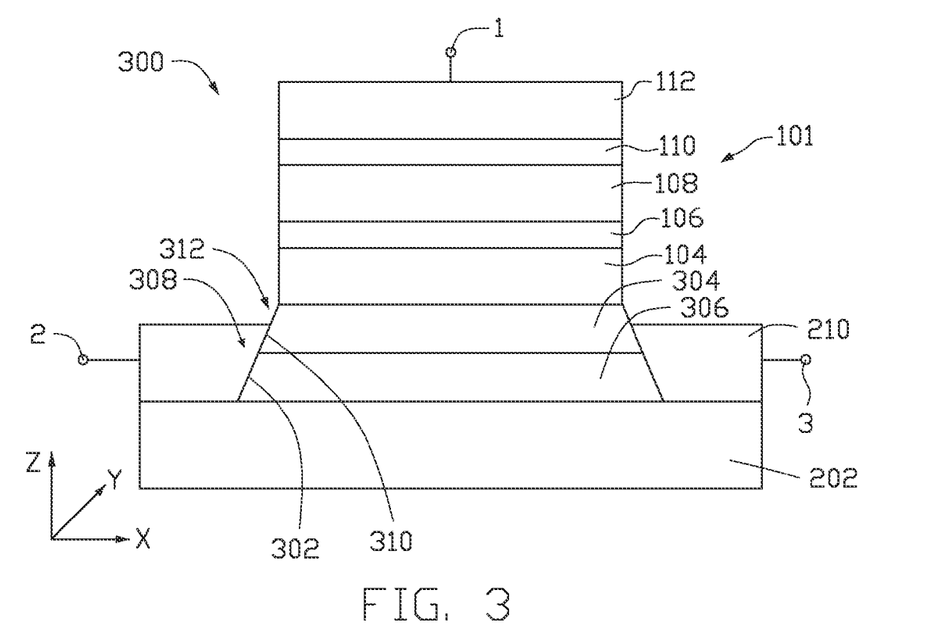
FIG. 3 illustrates an improved element of an SOT-MRAM device, according to a similar embodiment.

FIG. 3 illustrates an improved element 300 of an SOT-MRAM, according to another embodiment disclosed herein. The element 300 includes the AFM layer 202, a ferromagnetic bias layer 306, a nonmagnetic spin Hall effect layer 304, the free layer 104, the tunnel barrier layer 106, the reference layer 108, the AP-coupling (ruthenium) layer 110, and the hard layer 112. The spin Hall effect layer 304 is positioned beneath the free layer 104, and is in contact with the free layer 104. The spin Hall effect layer 304 is formed from a material that is not magnetic and exhibits substantial spin Hall effect. The ferromagnetic bias layer 306 is substantially similar to the ferromagnetic bias layer 206 in FIG. 2. However, the ferromagnetic bias layer 306 includes tapered edges 302. The tapered edges 302 may be obtained by adjusting the milling angle. A slope 308 of the tapered edge 302 provides additional knob to tune the strength of the stray field from the ferromagnetic bias layer 306 to the free layer 104. The spin Hall effect layer 304 is substantially similar to the spin Hall effect layer 204 in FIG. 2. However, the spin Hall effect layer 304 includes tapered edges 310. The tapered edges 310 may be obtained by adjusting the milling angle. A slope 312 of the tapered edge 310 provides additional knob to amplify the fraction of the write current that flows in the spin Hall effect layer 304 by direct conduction through the interface of spin Hall effect layer 304 and capping layer 210.

The tapered edges 302 of the ferromagnetic bias layer 306 aids in allowing the capping layer 210 be as close as possible to the spin Hall effect layer 304 while preventing deposition (or re-deposition) on the side walls of the free layer 104.

Figure 4A:
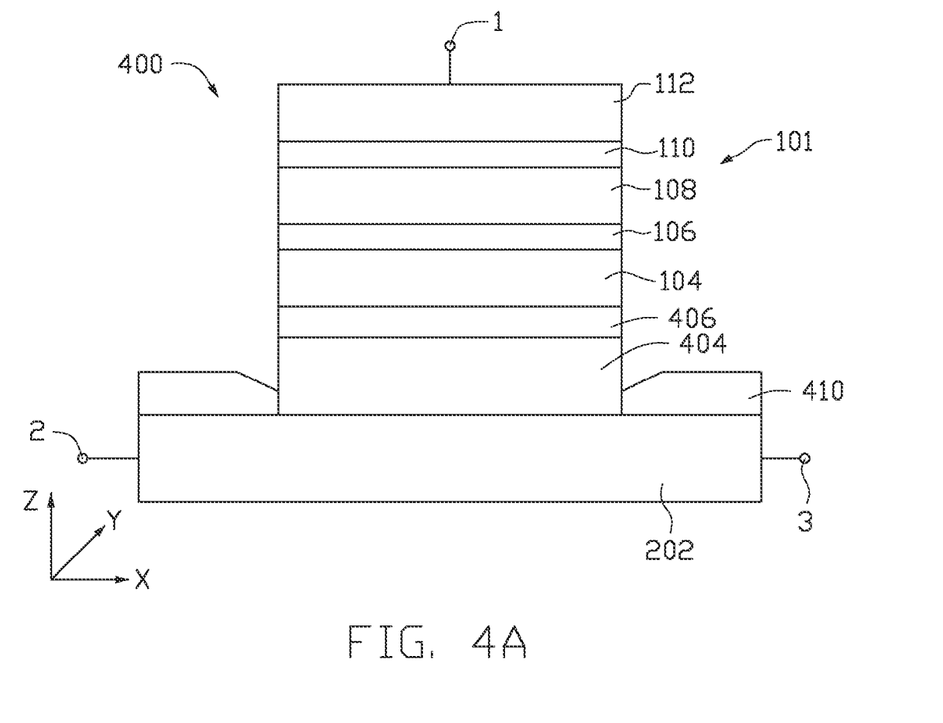
FIG. 4A illustrates an improved element of a SOT-MRAM device, according to one embodiment.

FIG. 4A illustrates an improved element 400 of an SOT-MRAM, according to another embodiment disclosed herein. The element 400 includes the AFM layer 202, a ferromagnetic bias layer 404, which additionally exhibits substantial anomalous-Hall-effect (AHE), a nonmagnetic spacer layer 406, the free layer 104, the tunnel barrier layer 106, the reference layer 108, the AP-coupling (ruthenium) layer 110, and the hard layer 112. The ferromagnetic bias layer 404 is configured to exert a spin orbit torque on the free layer 104, thus serving as a spin-orbit torque (SOT) layer. The anomalous Hall effect is exhibited in ferromagnetic materials, such as Fe, Ni, Co, and their alloys that may include B, Ge, Mn, Al, etc. The ferromagnetic bias layer 404 is also configured to provide a magnetic bias field to the free layer 104 to achieve deterministic switching of the magnetization of the free layer 104. Because the ferromagnetic bias layer 404 is configured to generate a magnetic bias field, the ferromagnetic bias layer 404 eliminates the need for permanent magnets (as shown in FIG. 1), and simplifies the chip design for SOT-MRAM cells.

The AFM layer 202 is configured to pin the magnetization direction of the ferromagnetic bias layer 404, along a preferred direction in the x-y plane via exchange bias. In one embodiment, the AFM layer 202 may be composed of an antiferromagnetic material. For example, the AFM layer 202 may comprise IrMn.

The spacer layer 406 is positioned between the ferromagnetic bias layer 404 and the free layer 104. The spacer layer 406 is configured to magnetically decouple the ferromagnetic bias layer 404 from the free layer 104, and allow spin current generated in the ferromagnetic bias layer 404 via anomalous Hall effect to pass efficiently from the ferromagnetic bias layer 404 to the free layer 104 and exert torque. It is preferable that the spacer layer 406 have a spin diffusion length that is large compared to its thickness (e.g., such as Cu, Ag, or Au), but also preferable that the spacer layer 406 have a relatively large resistivity so to minimize shunting of current away from passing through the ferromagnetic bias layer 404. For example, the spacer layer 406 may be a non-magnetic metallic, high resistivity alloy such as AgSn.

The element 400 further includes three terminals: terminal 1, terminal 2, and terminal 3. Write current, $I_{wr}$, may be applied through terminal 2 and terminal 3, some (preferably large) fraction of which will flow in the ferromagnetic bias layer 404. A read current, $I_{rd}$, may be applied through the element 400 from terminal 1 to terminal 3.

The ferromagnetic bias layer 404, via its stray field, also produces a magnetic bias field on the free layer 104 in the plane with the write current, $I_{wr}$. When the magnetization direction of the ferromagnetic bias layer 404 is parallel to the direction of the write current $I_{wr}$, the magnetic bias field has its maximum in the x-direction, but no spin current is produced and no spin-orbit torque is exerted on the free layer 104. When the magnetization direction is perpendicular to the direction of the write current $I_{wr}$, and oriented along the y-direction, spin current flow in the z-direction towards the free layer 104 is at its maximum, but no magnetic bias is produced in the x-direction.

Figure 4B:
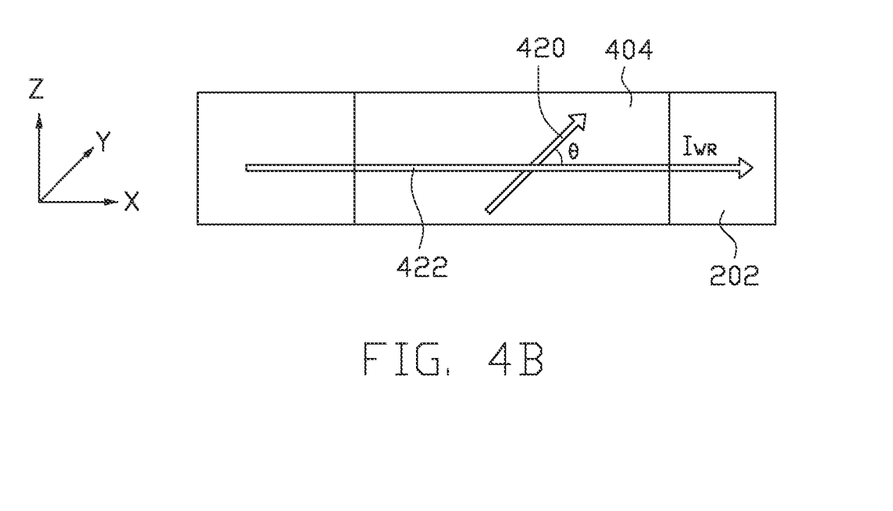
FIG. 4B illustrates a top view of the element of an SOT-MRAM device illustrated in FIG. 4A.

FIG. 4B illustrates a top view of element 400, according to one embodiment disclosed herein. To achieve both a magnetic bias field in the x-direction and y-polarized spin current in the z-direction to deterministically switch magnetization of the free layer 104, the magnetization of the ferromagnetic bias layer 404 and the write current $I_{wr}$ must be such that an angle θ in the x-y plane exists between a magnetization direction 420 and a direction 422 of the current $I_{wr}$. To maintain the angle θ between the direction of the magnetization and the direction of the write current $I_{wr}$, the AFM layer 202 pins, or stabilizes, the magnetization direction of the ferromagnetic bias layer 404. The angle θ may be chosen as to provide optimal switching performance of the magnetization direction in the free layer 104. The angle θ may be, for example, approximately 45 degrees.

Due to the high resistivity of most materials for the AFM layer 202 (e.g. IrMn), the Joule heating between adjacent memory cells from running a high current density in the AFM layer 202 may be problematic. A capping layer 410 may be deposited on the AFM layer 202 to cover most, if not all, of the AFM layer 202, excluding an area directly in-stack beneath the ferromagnetic bias layer 404. The capping layer 410 may be formed from a high conductivity material, such as gold, copper, or silver.

Figure 5:
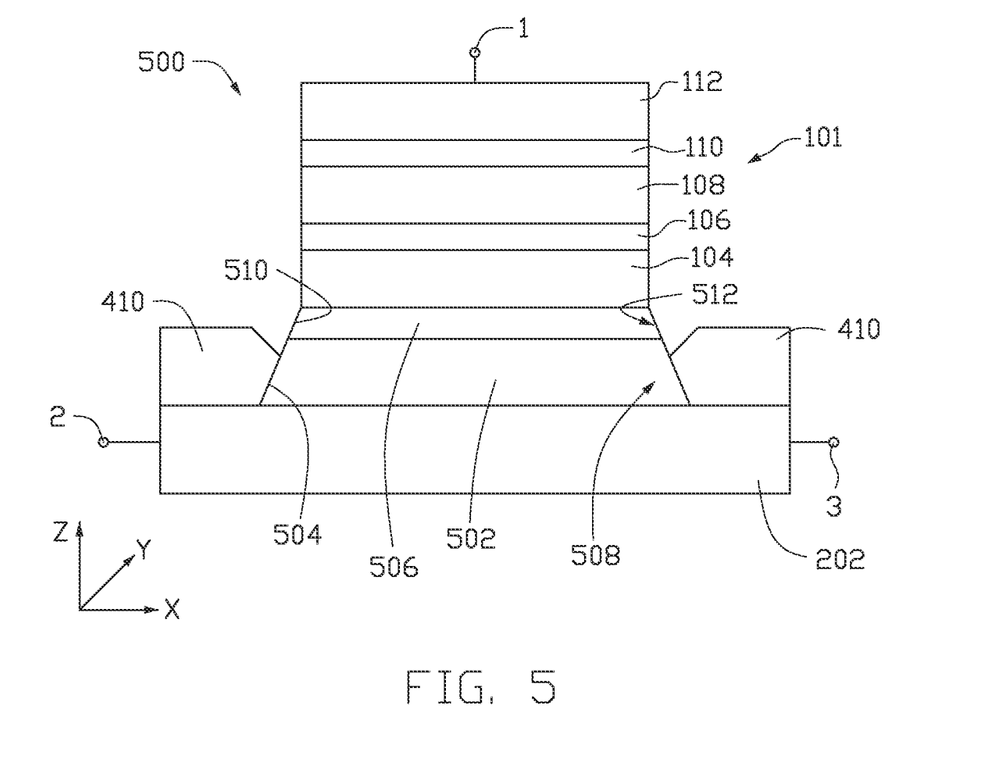
FIG. 5 illustrates an improved element of an SOT-MRAM device, according to another embodiment.

FIG. 5 illustrates an improved element 500 of an SOT-MRAM device, according to one embodiment disclosed herein. The element 500 includes the AFM layer 202, a ferromagnetic bias layer 502, which additionally exhibits substantial anomalous-Hall-effect (AHE), a nonmagnetic spacer layer 506, the free layer 104, the tunnel barrier layer 106, the reference layer 108, the AP-coupling (ruthenium) layer 110, and the hard layer 112. The ferromagnetic bias layer 502 is substantially similar to the ferromagnetic bias layer 404 in FIG. 4A. However, the ferromagnetic bias layer 502 includes tapered edges 504. The tapered edges 504 may be obtained by adjusting the milling angle. A slope 508 of the tapered edge 504 provides additional knob to tune the strength of the stray field from the ferromagnetic bias layer 502 to the free layer 104 and the current density in the ferromagnetic bias layer 502. The spacer layer 506 is substantially similar to the spacer layer 406 in FIG. 4A. However, the spacer layer 506 includes tapered edges 510. The tapered edges 510 may be obtained by adjusting the milling angle. A slope 512 of the tapered edge 510 provides additional knob to amplify the fraction of write current passing through the ferromagnetic bias layer 502 by direct conduction the through the interface between capping layer 410 and the ferromagnetic bias layer 502, and hence increase spin torque.

The tapered edges 504 of the ferromagnetic bias layer 502 aids in allowing the capping layer 410 be as close as possible to the ferromagnetic bias layer 502 while preventing deposition (or re-deposition) on the side walls of the free layer 104.

Figure 6:
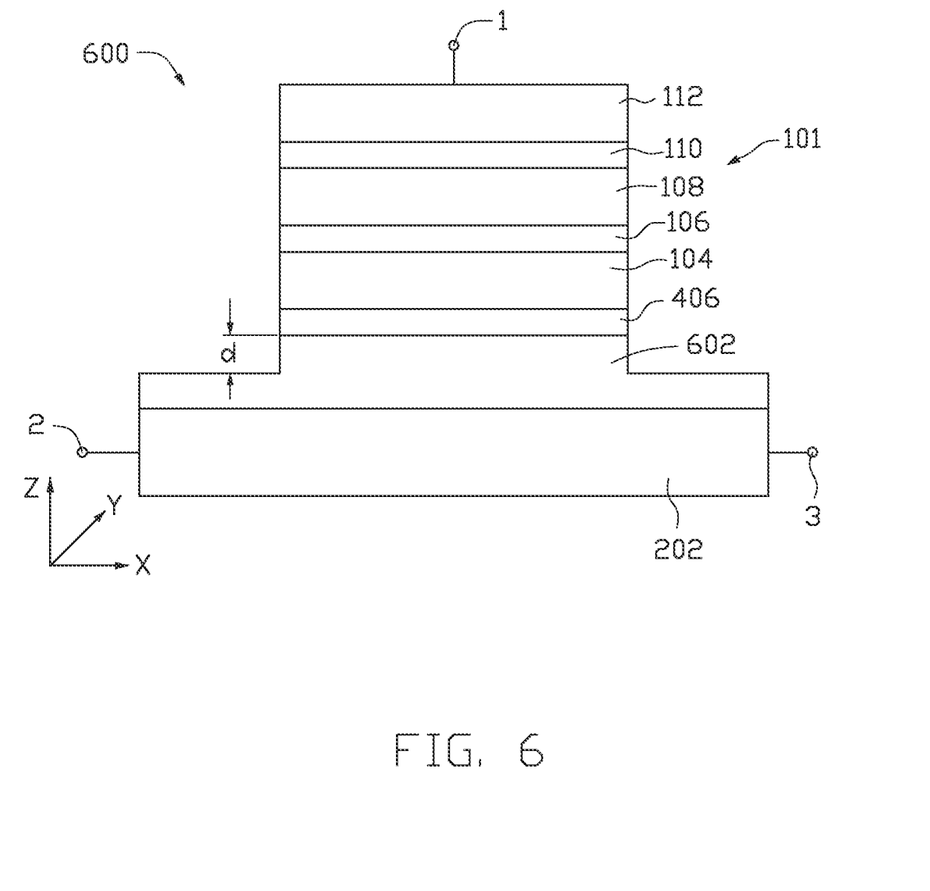
FIG. 6 illustrates an improved element of an SOT-MRAM device, according to another embodiment.

FIG. 6 illustrates an improved element 600 of an SOT-MRAM, according to one embodiment disclosed herein. The element 600 includes the AFM layer 202, ferromagnetic bias layer 602, which additionally exhibits substantial anomalous-Hall-effect (AHE), the nonmagnetic spacer layer 406, the free layer 104, the tunnel barrier layer 106, the reference layer 108, the AP-coupling (ruthenium) layer 110, and the hard layer 112. The ferromagnetic bias layer 602 is substantially similar to the ferromagnetic bias layer 404 in FIG. 4A. However, the ferromagnetic bias layer 602 is partially milled to a depth, d, with respect to the spacer layer 406. The milling depth, d, provides additional knob for adjusting the strength of the stray magnetic field on the free layer 104, as well as the current density through the ferromagnetic bias layer 602. The milling depth may be anywhere between 0 nm and t nm, where t is the thickness of the ferromagnetic bias layer 602.

As shown, the improved SOT-MRAM cells having a ferromagnetic bias layer simplifies the chip design for SOT-MRAM devices from conventional SOT-MRAM devices and lowers the potential memory density limitations of STT-MRAM devices.

While the foregoing is directed to embodiments of the present disclosure, other and further embodiments of the disclosure may be devised without departing from the basic scope thereof, and the scope thereof is determined by the claims that follow.

What is claimed is:

1. A spin orbit torque magnetoresistive random access memory (SOT-MRAM) cell, comprising:
   a magnetic tunnel junction, comprising:
      a free layer having primarily two bi-stable magnetization directions;
      a reference layer having a fixed magnetization direction; and
      an insulating tunnel barrier layer positioned between the free layer and the reference layer;
   a ferromagnetic bias layer configured to provide spin orbit torque via anomalous Hall effect and simultaneously configured to provide a magnetic bias field on the free layer to achieve deterministic switching, wherein the ferromagnetic bias layer comprises tapered edges; and
   an antiferromagnetic (AFM) layer positioned adjacent to the ferromagnetic bias layer, configured to pin a magnetization direction of the ferromagnetic bias layer in a pre-determined direction.

2. The SOT-MRAM cell of claim 1, further comprising: a conductive capping layer disposed on the AFM layer.

3. The SOT-MRAM cell of claim 1, further comprising a nonmagnetic spin Hall effect layer.

4. The SOT-MRAM cell of claim 3, wherein the spin Hall effect layer is formed from Pt, Ta, W, or copper doped with either bismuth or iridium, or combinations thereof.

5. The SOT-MRAM cell of claim 1, wherein the tapered edges have a slope configured to provide additional knob to tune a strength of a stray field from the ferromagnetic bias layer to the free layer and a current density in the ferromagnetic bias layer.

6. The SOT-MRAM cell of claim 1, wherein the ferromagnetic bias layer is milled.

7. A spin orbit torque magnetoresistive random access memory (SOT-MRAM) cell, comprising:
   a magnetic free layer;
   a ferromagnetic bias layer configured to produce an anomalous Hall effect to provide spin orbit torque, and simultaneously configured to provide a magnetic bias field to deterministically switch the free layer from a first magnetization state to a second magnetization state, wherein the ferromagnetic bias layer comprises tapered edges;
   a spacer positioned between the free layer and the ferromagnetic bias layer to magnetically decouple the free layer from the ferromagnetic bias layer and to pass spin current from the ferromagnetic bias layer to the free layer; and
   an antiferromagnetic layer positioned adjacent to the ferromagnetic bias layer, the antiferromagnetic layer configured to exchange pin a magnetization direction of the ferromagnetic bias layer.

8. The SOT-MRAM cell of claim 7, further comprising:
   a reference layer having a fixed magnetization direction; and
   an insulating tunnel barrier layer positioned between the free layer and the reference layer, wherein the free layer, the tunnel barrier layer, and the reference layer are collectively a magnetic tunnel junction.

9. The SOT-MRAM cell of claim 7, further comprising a non-magnetic spin Hall effect layer.

10. The SOT-MRAM cell of claim 9, wherein the spin Hall effect layer is formed from Pt, Ta, W, or copper doped with either bismuth or iridium, or combinations thereof.

11. The SOT-MRAM cell of claim 7, wherein the tapered edges have a slope configured to provide additional knob to tune a strength of a stray field from the ferromagnetic bias layer to the free layer and a current density in the ferromagnetic bias layer.

12. The SOT-MRAM cell of claim 7, wherein the ferromagnetic bias layer is milled.

13. A spin orbit torque magnetoresistive random access memory (SOT-MRAM) cell, comprising: a magnetic tunnel junction, comprising: a free layer having primarily two bi-stable magnetization directions; a reference layer having a fixed magnetization direction; and an insulating tunnel barrier layer positioned between the free layer and the reference layer; a ferromagnetic bias layer configured to provide spin orbit torque via anomalous Hall effect and simultaneously configured to provide a magnetic bias field on the free layer to achieve deterministic switching; an antiferromagnetic (AFM) layer positioned adjacent to the ferromagnetic bias layer, configured to pin a magnetization direction of the ferromagnetic bias layer in a pre-determined direction; and a conductive capping layer disposed directly on and substantially covering an extended portion of the ferromagnetic bias layer.

14. The SOT-MRAM cell of claim 13, further comprising a nonmagnetic spin Hall effect layer.

15. The SOT-MRAM cell of claim 14, wherein the spin Hall effect layer is formed from Pt, Ta, W, or copper doped with either bismuth or iridium, or combinations thereof.

16. The SOT-MRAM cell of claim 13, wherein the ferromagnetic bias layer is milled.

* * * * *